(12) United States Patent
Doan

(10) Patent No.: US 7,368,014 B2
(45) Date of Patent: May 6, 2008

(54) VARIABLE TEMPERATURE DEPOSITION METHODS

(75) Inventor: Trung Tri Doan, Vallejo, CA (US)

(73) Assignee: Micron Technology, Inc., Boise, ID (US)

( * ) Notice: Subject to any disclaimer, the term of this patent is extended or adjusted under 35 U.S.C. 154(b) by 347 days.

(21) Appl. No.: 09/927,230

(22) Filed: Aug. 9, 2001

(65) Prior Publication Data

US 2003/0031787 A1    Feb. 13, 2003

(51) Int. Cl.
 *C30B 29/02* (2006.01)
(52) U.S. Cl. .............................. 117/89; 117/85; 117/86; 117/94; 117/95; 117/101
(58) Field of Classification Search ................. 117/89, 117/85, 86, 94, 95, 101
See application file for complete search history.

(56) References Cited

U.S. PATENT DOCUMENTS

| | | | |
|---|---|---|---|
| 3,785,853 A | 1/1974 | Kirkman et al. | |
| 4,058,430 A | 11/1977 | Suntola et al. | |
| 4,369,105 A | 1/1983 | Caldwell et al. | 204/290 F |
| 4,789,648 A | 12/1988 | Chow et al. | |
| 4,831,003 A | 5/1989 | Lang et al. | 502/182 |
| 4,913,090 A | 4/1990 | Harada et al. | |
| 5,116,640 A | 5/1992 | Mikami et al. | |
| 5,124,278 A | 6/1992 | Bohling et al. | |
| 5,270,247 A | 12/1993 | Sakuma et al. | |
| 5,273,930 A | 12/1993 | Steele et al. | |
| 5,281,274 A | 1/1994 | Yoder | |
| 5,366,555 A | 11/1994 | Kelly | |
| 5,366,953 A | 11/1994 | Char et al. | |
| 5,413,671 A | 5/1995 | Ketchum | |

(Continued)

FOREIGN PATENT DOCUMENTS

EP    0 794 568    10/1997

(Continued)

OTHER PUBLICATIONS

Noah Precision, Inc., Internet website: http://www.noahprecision.com/tec.htm; "Thermoelectric Temperature Control" 1998, pp. 1-2.

(Continued)

*Primary Examiner*—Robert Kunemund
(74) *Attorney, Agent, or Firm*—Wells St. John P.S.

(57) ABSTRACT

A deposition method may include, at a first temperature, contacting a substrate with a first precursor and chemisorbing a first layer at least one monolayer thick over the substrate. At a second temperature different from the first temperature, the first layer may be contacted with a second precursor, chemisorbing a second layer at least one monolayer thick on the first layer. Temperature may be altered by adding or removing heat with a thermoelectric heat pump. The altering the substrate temperature may occur from the first to the second temperature. The second layer may be reacted with the first layer by heating to a third temperature higher than the second temperature. A deposition method may also include atomic layer depositing a first specie of a substrate approximately at an optimum temperature for the first specie deposition. A second specie may be atomic layer deposited on the first specie approximately at an optimum temperature for the second specie deposition different from the first specie optimum temperature.

44 Claims, 2 Drawing Sheets

U.S. PATENT DOCUMENTS

| | | | |
|---|---|---|---|
| 5,462,603 A | 10/1995 | Murakami | |
| 5,480,818 A | 1/1996 | Matsumoto et al. | 437/40 |
| 5,597,609 A | 1/1997 | Beisswenger et al. | |
| 5,597,756 A | 1/1997 | Fazan et al. | |
| 5,616,208 A | 4/1997 | Lee | |
| 5,747,113 A | 5/1998 | Tsai | |
| 5,879,459 A | 3/1999 | Gadgil et al. | |
| 5,916,365 A | 6/1999 | Sherman | |
| 5,929,526 A | 7/1999 | Srinivasan et al. | |
| 5,937,300 A | 8/1999 | Sekine et al. | |
| 5,985,770 A | 11/1999 | Sandhu et al. | |
| 5,997,588 A | 12/1999 | Goodwin et al. | |
| 6,042,652 A | 3/2000 | Hyun et al. | |
| 6,060,383 A | 5/2000 | Nogami et al. | |
| 6,066,358 A | 5/2000 | Guo | |
| 6,083,832 A | 7/2000 | Sugai | 438/672 |
| 6,114,099 A | 9/2000 | Liu et al. | |
| 6,139,695 A | 10/2000 | Washburn et al. | |
| 6,143,659 A * | 11/2000 | Leem | 438/688 |
| 6,165,916 A | 12/2000 | Muraoka et al. | |
| 6,174,377 B1 | 1/2001 | Doering et al. | |
| 6,203,613 B1 | 3/2001 | Gates et al. | 117/104 |
| 6,203,619 B1 | 3/2001 | McMillan | |
| 6,235,571 B1 | 5/2001 | Doan | |
| 6,258,690 B1 | 7/2001 | Zenke | |
| 6,270,572 B1 | 8/2001 | Kim et al. | 117/93 |
| 6,287,965 B1 | 9/2001 | Kang et al. | 438/648 |
| 6,290,824 B1 | 9/2001 | Ishikawa et al. | |
| 6,306,216 B1 | 10/2001 | Kim et al. | |
| 6,307,184 B1 | 10/2001 | Womack et al. | |
| 6,335,561 B2 | 1/2002 | Imoto | |
| 6,338,874 B1 | 1/2002 | Law et al. | |
| 6,355,561 B1 | 3/2002 | Sandhu et al. | |
| 6,358,377 B1 | 3/2002 | Schloremberg et al. | |
| 6,368,954 B1 | 4/2002 | Lopatin et al. | |
| 6,399,921 B1 | 6/2002 | Johnsgard et al. | |
| 6,420,230 B1 * | 7/2002 | Derderian et al. | 438/255 |
| 6,447,908 B2 * | 9/2002 | Yun et al. | 428/403 |
| 6,458,416 B1 | 10/2002 | Derderian et al. | |
| 6,479,902 B1 | 11/2002 | Lopatin et al. | |
| 6,596,636 B2 | 7/2003 | Sandhu | |
| 6,620,723 B1 | 9/2003 | Byun et al. | |
| 6,627,260 B2 | 9/2003 | Derderian et al. | |
| 6,627,503 B2 | 9/2003 | Ma et al. | |
| 6,630,201 B2 * | 10/2003 | Chiang et al. | 427/255.28 |
| 6,727,169 B1 | 4/2004 | Raaijmakers et al. | |
| 6,987,073 B2 * | 1/2006 | Mercaldi | 438/791 |
| 2002/0066411 A1 * | 6/2002 | Chiang et al. | 118/724 |
| 2002/0125516 A1 | 9/2002 | Marsh et al. | |
| 2003/0129826 A1 * | 7/2003 | Werkhoven et al. | 438/627 |
| 2005/0101119 A1 | 5/2005 | Li et al. | |
| 2005/0124153 A1 | 6/2005 | Cohen | |
| 2005/0124158 A1 | 6/2005 | Lopatin et al. | |
| 2005/0124171 A1 | 6/2005 | Vaartstra | |

FOREIGN PATENT DOCUMENTS

| | | |
|---|---|---|
| JP | 02-151023 | 6/1990 |
| JP | 05251339 | 9/1993 |
| JP | 05-326412 | 12/1993 |
| JP | 06-283427 | 10/1994 |
| JP | 06-283493 | 10/1994 |
| JP | 07254545 A | 10/1995 |

OTHER PUBLICATIONS

Noah Precision, Inc., Internet website: http://www.noahprecision.com/cvd.htm; "CVD" 1998, pp. 1-2.

Kiyoko et al., Patent Abstract Application No. 04-024917 (JP 9224917, Sep. 1993), "Semiconductor Substrate and Its Manufacture.".

Ritala, et al., "Atomic Layer Epitaxy—A Valuable Tool for Nanotechnology?" Nanotechnology, vol. 10, No. 1, pp. 19-24, Mar. 1999.

George, et al., "Surface Chemistry for Atomic Layer Growth", Journal of Physical Chemistry, vol. 100, No. 31, pp. 13121-13131, Aug. 1, 1996.

Suntola, "Atomic Layer Epitaxy", Handbook of Crystal Growth, vol. 3, Chapter 14, pp. 602-663, 1994.

Vernon, S.M., "Low-cost, high-efficiency solar cells utilizing GaAs-on-Si technology." Dialog Abstract of Report No. NREL/TP-451-5353; Apr. 1993.

U.S. Appl. No. 09/643,004, filed Aug. 21, 2000, Mercaldi.
U.S. Appl. No. 09/619,449, filed Jul. 19, 2000, Derderian.
U.S. Appl. No. 09/652,533, filed Aug. 31, 2000, Derderian.

Aarik, et al, "Control of Thin Film Structure by Reactant Pressure in Atomic Layer Deposition of $TiO_2$.", Journal of Crystal Growth, 169 (1996) pp. 496-502.

Suntola, "Surface Chemistry of Materials Deposition at Atomic Layer Level", Applied Surface Science, vol. 100/101, Mar. 1996, pp. 391-398.

Aarik et al, "Effect of Growth Conditions on Formation of $TiO_2$-II Thin Films in Atomic Layer Deposition Process", Journal of Crystal Growth, vol. 181, Aug. 1997, pp. 259-264.

Skarp, "ALE-Reactor for Large Area Depositions", Applied Surface Science, vol. 112, Mar. 1997, pp. 251-254.

U.S. Appl. No. 09/652,533, (As amended Feb. 22, 2002, Jan. 6, 2003, Jun. 23, 2003, & Nov. 14, 2003).

U.S. Appl. No. 09/643,004, (As amended Sep. 26, 2002 & Mar. 20, 2003).

* cited by examiner

VARIABLE TEMPERATURE DEPOSITION METHODS

TECHNICAL FIELD

The aspects of the invention relate to variable temperature deposition methods, including atomic layer deposition and other deposition methods, and integrated circuits formed thereby.

BACKGROUND OF THE INVENTION

Atomic layer deposition (ALD) is recognized as a deposition technique that forms high quality materials with minimal defects and tight statistical process control. Even so, it is equally recognized that ALD can have limited application. In some circumstances, the theoretically expected quality of an ALD layer is not achieved.

It can be seen that a need exists for an ALD method that forms a layer without introducing intolerable defects into the material.

SUMMARY OF THE INVENTION

As one aspect of the invention, a deposition method includes at a first temperature, contacting a substrate with a first precursor and chemisorbing a first layer at least one monolayer thick over the substrate. At a second temperature different from the first temperature, the first layer may be contacted with a second precursor, chemisorbing a second layer at least one monolayer thick on the first layer. As an example, the method can further include heating the first layer and the second layer to a third temperature higher than the second temperature. The method can include altering temperature by adding or removing heat with a thermoelectric heat pump to establish the second temperature. The thermoelectric heat pump may thermally connect to the substrate. The first temperature may be at least about 5° C. different than the second temperature.

Another aspect of the invention provides a deposition method including atomic layer depositing a first specie over a substrate approximately at an optimum temperature for the first specie deposition. A second specie may be atomic layer deposited on the first specie approximately at an optimum temperature for the second specie deposition different from the first specie optimum temperature. As an example, a chemisorption product of the first and second species may consist essentially of a monolayer of a deposition material.

In another aspect of the invention, a deposition method includes chemisorbing a first layer of a first compound over a substrate while maintaining the substrate at a first temperature with a heater thermally linked to the substrate. Heat may be added or removed with a device different from the heater exhibiting a thermoelectric effect. This may establish the substrate at a second temperature at least about 1° C. different from the first temperature. A monolayer of a second compound may be chemisorbed on the first monolayer of the first compound at the second substrate temperature. Heat may be added or removed with the device to establish the substrate at approximately the first temperature. A second monolayer of the first compound may be chemisorbed on the monolayer of the second compound.

As an alternative to the method described immediately above, heat can be added with the device to establish the substrate at a third temperature higher than the second temperature and the chemisorbed second compound reacted with the chemisorbed first compound. Heat can be added or removed with the device to establish the substrate at approximately the first temperature. A second monolayer of the first compound can be chemisorbed on the reacted layer of first and second compounds.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
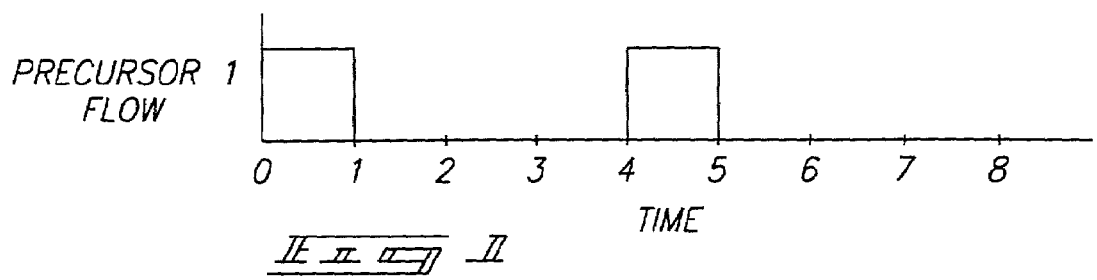
FIGS. 1-3 are line charts respectively showing the timing for contacting a substrate in an atomic layer deposition process with precursor 1, precursor 2, and purge gas.

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to chemisorb onto the first monolayer of the first specie. The second specie is then purged and the steps are repeated with exposure of the second specie monolayer to the first specie. In some cases, the two monolayers may be of the same specie. Also, a third specie or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a specie contacting the substrate and/or chemisorbed specie. Examples of carrier gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate. However, process conditions can be varied in ALD to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include silicon nitride, zirconium oxide, tantalum oxide, aluminum oxide, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent species may next chemisorb to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

Observation indicates that ALD can be susceptible to temperature variation such that a change of about 1 to 11° C. to about 50° C. may significantly affect chemisorption rate, and potentially stop appreciable chemisorption. Further observation indicates that one deposition specie may chemisorb optimally at a first temperature while a second deposition specie may chemisorb at a different optimum temperature. If the two species are to be used as complimentary species of a deposition pair, then it is not likely that chemisorption will be performed optimally for both species of the pair.

Accordingly, in one aspect of the invention, a deposition method includes, at a first temperature, contacting a substrate with a first precursor and chemisorbing a first layer at least one monolayer thick over the substrate. At a second temperature different from the first temperature, the first layer may be contacted with a second precursor. A second layer at least one monolayer thick may be chemisorbed on the first layer. Such a method may be implemented in a variety of ways and applied to a variety of circumstances. However, preferably the substrate is a bulk semiconductor wafer. Also, while a variety of precursors and precursor pairs may be selected, preferably the first precursor is different from the second precursor. Such a difference may be sufficient to produce an optimum chemisorption temperature for the first precursor that is different from an optimum chemisorption temperature for the second precursor. Also, preferably the first and second layers each consist essentially of a monolayer.

Altering the temperature may be accomplished by a variety of means and in a variety of ways. For example, the method may further include altering the temperature by adding or removing heat with a thermoelectric heat pump (THP). A THP operates on the well known principles of the thermoelectric effect based on one or more of the Peltier effect, Seebeck effect, Thomson effect, and other effects. THPs may provide both thermoelectric cooling and thermoelectric heating. In thermoelectric cooling, heat is absorbed when an electric current is applied through a "cold" junction of two dissimilar conductors and transferred to a "hot" junction of the conductors where it may be dissipated, for example, by a heat sink. For thermoelectric heating, reversing the current direction will reverse the heat flow such that the cold junction temperature increases with heat transferred from the hot junction. THPs may be fabricated from dissimilar metal conductors, but often are semiconductor based, using p- and n-type semiconductors instead. As the term is used herein a THP may include any heating and/or cooling device operating by a thermoelectric effect.

A THP may be used to selectively heat or cool the substrate such that the first precursor is chemisorbed at approximately an optimum chemisorption temperature and the second precursor is also chemisorbed at approximately an optimum chemisorption temperature. Accordingly, it may be desirable that the THP thermally connect to the substrate. For example, in the case of a bulk semiconductor wafer, such wafer may be positioned in a wafer chuck in a deposition chamber. A thermal interface between the THP and the wafer chuck may be sufficient to thermally connect the wafer to the THP to accomplish altering the temperature of at least a portion of the substrate.

Often, a source of background heat is provided, for example in deposition chambers. Such background heat may originate from a variety of sources, such as reactant gas and/or carrier gas heaters, a heat lamp array associated with the chamber, and/or a wafer chuck heater separate from the THP. Accordingly, background heat may be provided at a fourth temperature different from or the same as one of the first and second temperature. A variety of heating and cooling process regimes are conceivable. The THP can be particularly useful when processing a single wafer through a series of steps, such as those described herein. However, the various aspects of the invention described herein also apply to processing without a THP. For example, batch processing of wafers without a THP is also conceivable in keeping with many of the process parameters set forth to achieve the described benefits. Also, providing a flow of coolant gas might be one alternative to cooling with a THP. The coolant gas can consist of material inert to reaction with the first compound. For example, the coolant gas can be an inert gas commonly used as a carrier gas in processing.

Preferably the first and second temperatures are those of at least a portion of the substrate. Alternatively, the first and second temperatures may be those of an outermost surface of the substrate, the precursors, deposition chamber temperature, precursor gas temperature, etc. Since the first and second temperatures need not be the substrate temperature, altering the substrate temperature need not, but may, occur from the first to the second temperature. Depending on a variety of considerations including, but not limited to, precursor specie characteristics, pressure, substrate composition, etc., the first temperature may be at least about 1° C. different from the second temperature. The first temperature may preferably be at least about 5° C. different and more preferably at least about 10° C. different. Further, the second temperature may be at least about 50° C. different from the second temperature. A deposition pressure can vary depending on the particular specie and can be atmospheric or at some degree of vacuum.

Another consideration in setting up a process regime is that after chemisorption of a first layer, altering a temperature of at least a portion of the substrate for chemisorption of a second layer can impact the already chemisorbed first layer. If a first layer is formed at a lower temperature followed by second layer formation at a higher temperature, then the temperature increase might desorb some of the first layer. Accordingly, preferably the first temperature is greater than the second temperature. In this manner, the first layer may be formed at a higher temperature followed by second layer formation at a lower temperature, decreasing the risk of desorption.

As a further consideration, chemisorption of the second precursor on the first precursor is not necessarily equivalent to reacting the first and second precursors. Also, an optimum temperature for reaction of the first and second precursor can be different from the optimum chemisorption temperatures of the first and second precursors. Accordingly, in some circumstances the physical properties and/or composition of chemisorbed first and second layers can differ from the desired properties and/or composition that could result from reaction of the chemisorbed materials of the first and second layers. According to one aspect of the invention, a deposition method can further include heating the first layer and the second layer to a third temperature higher than the second temperature at which the second layer was chemisorbed. Also, the method can further include reacting the second layer with the first layer. One example of reacting the first and second layers includes the heating to the third temperature described above. Other ways to react the first and second layers are also conceivable.

Yet another consideration in establishing a process regime is the timing of temperature alterations. For example, the second temperature may be established before the contacting of the first layer to chemisorb a second precursor thereon. Alternatively, the second temperature might not be established until during the contacting of the first layer to chemisorb the second precursor. Also for example, the third temperature might be established after completing chemisorption of a second precursor on the first layer. Alternatively, the third temperature might be established during the chemisorption of the second precursor. Establishing the third temperature during chemisorption of the second precursor allows already chemisorbed second precursor to react with the first layer and enhances reaction of the second precursor with any portions of the first layer whereon the second precursor has not yet chemisorbed. The selection of a particular process regime will preferably establish the most efficient chemisorption process practicable. That is, both chemisorption rate achieved at a given temperature as well as the necessary time to accomplish alteration of temperature to achieve such a rate may be considered along with other factors. Accordingly, the THP described herein may be particularly advantageous given the quick changes in substrate temperature achievable.

In another aspect of the invention, a deposition method includes atomic layer depositing a first specie over a substrate approximately at an optimum temperature for the first specie deposition. Next, a second specie may be atomic layer deposited on the first specie approximately at an optimum temperature for the second specie deposition different from the first specie optimum temperature. A chemisorption product of the first and second specie may consist essentially of a monolayer of a deposition material. As indicated above, the first specie may be different from the second specie. However, even if the first specie is the same as the second specie, a deposition method as described may be desirable. Atomic layer deposition of an initial specie to form the first layer of a chemisorption product sometimes may preferably occur at a different temperature from any subsequent layer. For example, a higher temperature may be warranted to achieve a substantially saturated monolayer on a substrate after which chemisorption to the first and subsequent deposition specie layers occurs at a lower temperature. In this manner, potential difficulties with initiating formation of an ALD material may be reduced.

As yet another aspect of the invention, a deposition method may include chemisorbing a first monolayer of a first compound over a substrate while maintaining the substrate at a first temperature with a heater thermally linked to the substrate. Heat may be added or removed with a device different from the heater. The device may exhibit a thermoelectric effect. The device may also establish the substrate at a second temperature at least about 5° C. different from the first temperature.

The method may further include chemisorbing a monolayer of a second compound on the first monolayer of the first compound at the second substrate temperature. Heat may be added or removed with the device to establish the substrate temperature at approximately the first temperature. A second monolayer of the first compound may be chemisorbed on the monolayer of the second compound.

Figure 2:
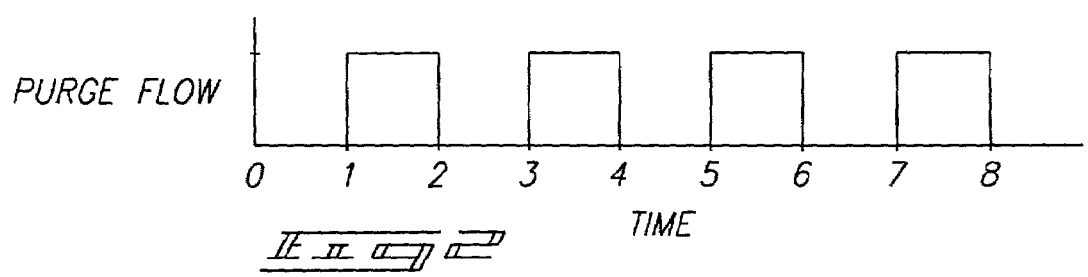
Figure 3:
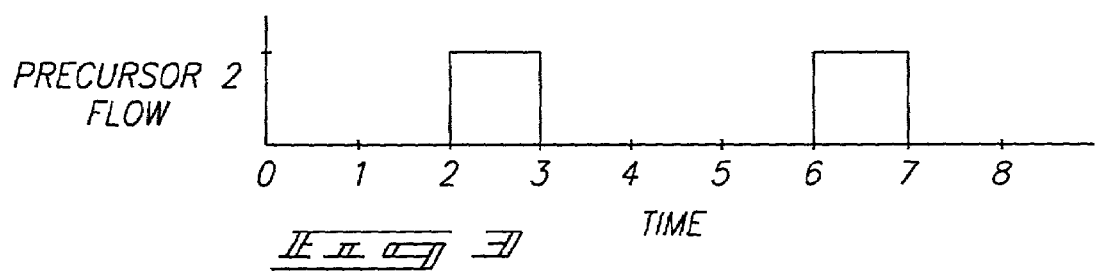

Turning to FIGS. 1-4, a process regime is described for ALD that is within the scope of the present invention. FIGS. 1-3 show the cyclic contacting and purging of a substrate with Precursor 1 (P1) and Precursor 2 (P2). A substrate is first contacted with P1 from Time 0 (T0) to Time 1 (T1). P1 that is not chemisorbed is purged from T1 to T2 and the chemisorbed P1 is then contacted with P2 from T2 to T3. After purging excess P2 from T3 to T4, the cycle begins again by contacting chemisorbed P2 with P1 from T4 to T5. The cycle from T0 to T3 thus may form at least a monolayer of a chemisorption product of P1 and P2. The purge from T3 to T4 prepares the chemisorption product of P1 and P2 to begin a new cycle at T4. Notably, the time intervals from T0 to T1 to T2, etc. are shown as equal merely for graphical convenience. In practice, such times may be individually determined according to the knowledge of those skilled in the art considering the aspects and advantages of the inventions described herein.

Figure 4:
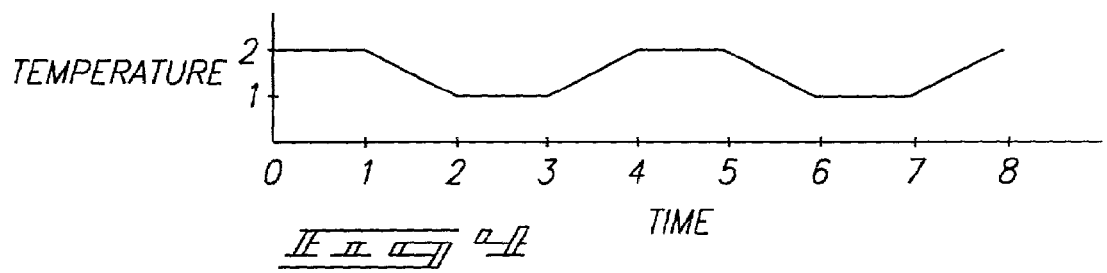
FIG. 4 is a line chart showing the timing for altering temperature during the contacting described in FIGS. 1-3.

FIG. 4 shows altering the temperature, preferably substrate temperature, as part of the described method. Temperature 2 (Temp2) is maintained from T0 to T1 during contacting of P1. Thereafter, temperature is reduced to Temp1 during purging from T1 to T2 and maintained at Temp1 during contacting of P2 from T2 to T3. Temperature is increased to Temp2 during purging from T3 to T4 in preparation for starting a new cycle at T4. In keeping with the various aspects of the invention, other scenarios of contacting precursors and altering temperature are also conceivable, some of which are expressly described herein.

Figure 5:
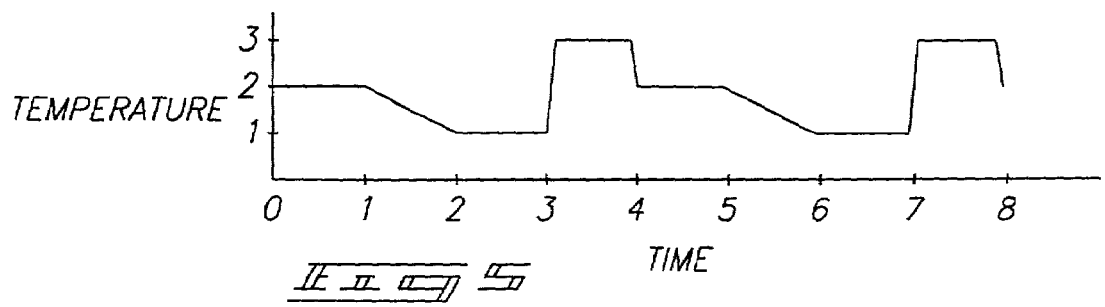
FIG. 5 is a line chart showing an alternative timing for altering temperature during the contacting described in FIGS. 1-3.

One alternative is shown in FIG. 5. Temp2 is maintained from T0 to T1 during contacting of P1. Thereafter, temperature is reduced to Temp1 during purging from T1 to T2 and maintained at Temp1 during contacting of P2 from T2 to T3. Temperature is increased to Temperature 3 (Temp3) during purging from T3 to T4 and then reduced to Temp2 in preparation for starting a new cycle at T4 and for enhancing reaction of P2 with P1.

Figure 6:
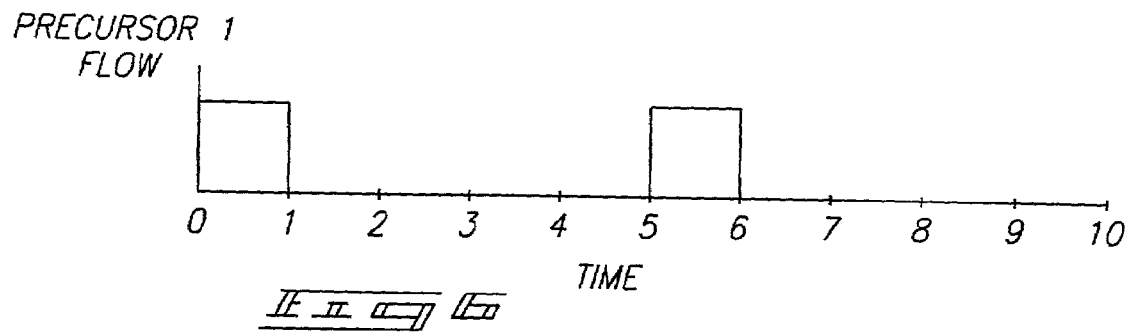
FIGS. 6-8 are line charts respectively showing an alternative timing for contacting a substrate in an atomic layer deposition process with precursor 1, precursor 2, and purge gas.
Figure 7:
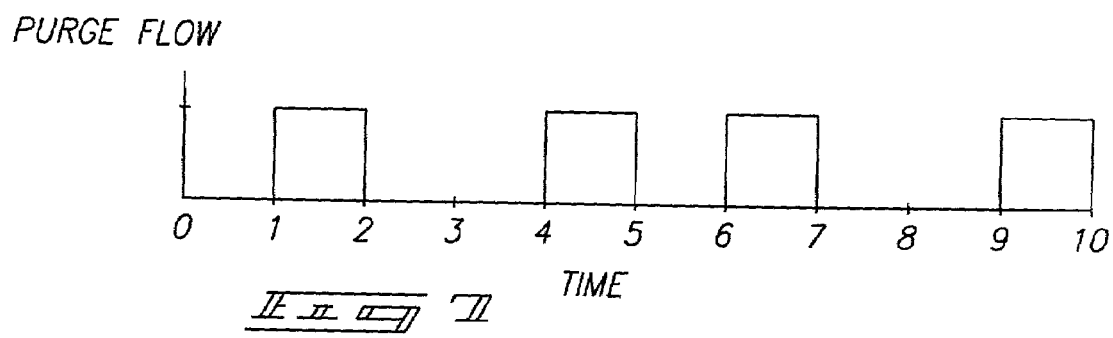
Figure 8:
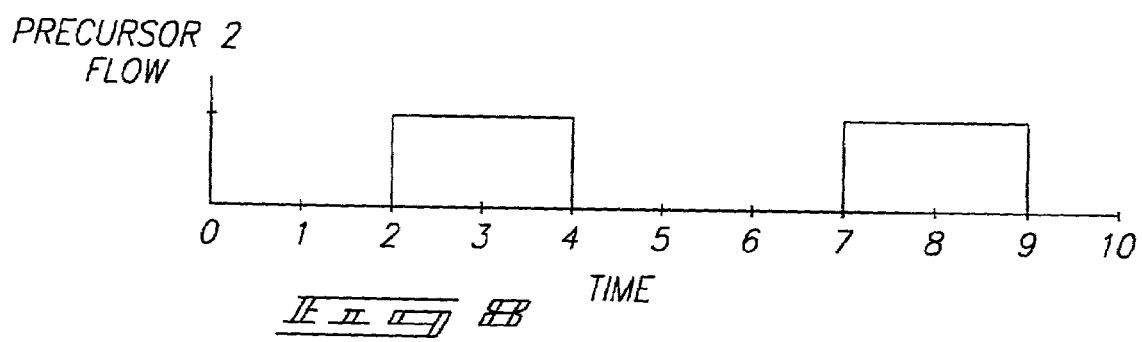

Turning to FIGS. 6-9 an alternative process regime is described for ALD that is within the scope of the present invention. FIGS. 6-8 show the cyclic contacting and purging of a substrate with P1 and P2. A substrate is first contacted with P1 from T0 to T1. P1 that is not chemisorbed is purged from T1 to T2 and the chemisorbed P1 is then contacted with P2 from T2 to T4. After purging excess P2 from T4 to T5, the cycle begins again by contacting chemisorbed P2 with P1 from T5 to T6.

Figure 9:
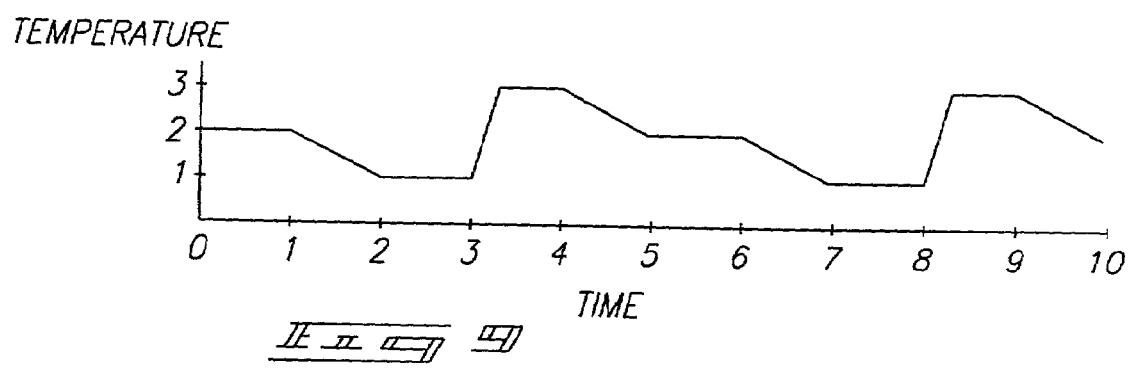
FIG. 9 is a line chart showing the timing for altering temperature during the contacting described in FIGS. 6-8.

FIG. 9 shows altering the temperature as part of the described method. Temp2 is maintained from T0 to T1 during contacting of P1. Thereafter, temperature is reduced to Temp1 during purging from T1 to T2 and maintained at Temp1 during at least a portion of contacting P2 from T2 to T3. Temperature is increased to Temp3 during at least a portion of contacting of P2 from T3 to T4. Temperature is decreased to Temp2 during purging from T4 to T5 in preparation for starting a new cycle at T5.

In keeping with the advantages of the various aspects of the invention described herein, materials may be deposited at increased rates and/or have increased quality as a result of achieving optimum deposition temperatures. Thus, devices formed using such methods may possess structures formed of materials having increased quality and/or decreased dimensions given the increased quality. That is, the thickness of a material, such as a barrier material, dielectric material, etc., might be beneficially reduced if the high quality associated with ALD and the deposition methods described herein may be achieved.

As one example of the method described herein, $Si_3N_4$ can be formed. Dichlorosilane (DCS) can be chemisorbed at a first temperature followed by chemisorption of ammonia at a second temperature lower than the first temperature. $Si_3N_4$ can be formed from the chemisorbed components by reacting the DCS and ammonia at a third temperature higher than the second temperature and the first temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invetion calimed is:

1. A deposition method comprising:
   at a first temperature, contacting a substrate with a first precursor containing dichlorosilane and chemisorbirig a first layer at least one monolayer thick over the substrate;
   altering the first temperature by removing heat by applying an electric currant through a cold junction of two dissimilar conductors or doped semiconductors of a thermoelectric heat pump thermally connected-to the substrate, transferring the current to a hot junction of the conductors or semiconductors, and dissipating heat from the hot junction to establish a second temperature;
   at the second temperature lower than the first temperature, contacting the first layer with a second precursor containing ammonia and chemisorbing a second layer at least one monolayer thick on the first layer; and
   reacting the second layer with the first layer and forming a $Si_3N_4$ layer.

2. The deposition method of claim 1 wherein the reacting comprises heating the first layer and the second layer to a third temperature higher than the second temperature and first temperature.

3. The deposition method of claim 2 wherein heating the first layer and the second layer to a third temperature comprises adding heat with the thermoelectric heat pump.

4. The deposition method of claim 1 wherein the second temperature is the optimum chemisorption temperature for the second precursor.

5. The deposition method of claim 4 wherein the first temperature is the optimum chemisorption temperature for the first precursor.

6. The deposition method of claim 1 wherein the second temperature is established before the contacting the first layer by Initiating a flow of the second precursor.

7. The deposition method of claim 1 wherein the second temperature is not established until during the contacting the first layer by providing a flow of the second precursor.

8. The deposition method of claim 1 wherein the first temperature is at least about 5° C. different than the second temperature.

9. The deposition method of claim 1 wherein the first temperature is at least about 50° C. different than the second temperature.

10. The deposition method of claim 1 wherein the first end second temperatures are those of at least a portion of the substrate.

11. The deposition method of claim 1 wherein the first and second temperatures are those of an outermost surface of the substrate.

12. The deposition method of claim 1 wherein the first and second temperatures are those of the, precursors.

13. The deposition method of claim 1 further comprising providing background heat.

14. The deposition method of claim 13 wherein the background heat is provided at a fourth temperature between the firstand second temperature.

15. The deposition method of claim 13 wherein the background heat originates primarily from a heat source comprising a heat lamp array or a wafer chuck heater.

16. The deposition method of claim 1 wherein the substrate comprises a bulk semiconductor wafer.

17. The deposition method of claim 1 wherein the first precursor consists of dichiorosilane and the second precursor consists of ammonia.

18. The deposition method of claim 1 wherein the first and second layers each consist essentially of a monolayer.

19. The deposition method of claim 1 wherein at least one of the first precursor and the second precursor comprise a plurality of different precursor species.

20. The deposition method of claim 1 wherein the first and second precursors each consists essentially of a single precursor specie.

21. The deposition method of claim 20 wherein the single precursor specie exhibits only one chemical structure.

22. The deposition method of claim 1 further comprising purging the first precursor before contacting the first layer with the second precursor.

23. A deposition method comprising:
atomic layer depositing a first specie over a substrate approximately at an optimum temperature for the first specie deposition;
removing heat by applying an electric current through a cold junction of two dissimilar conductors or doped semiconductors of a thermoelectric heat pump thermally connected to the substrate, transferring the current to a hot junction of the conductors or semiconductors, dissipating heat from the hot junction, and atomic layer depositing a second specie on the first specie approximately at an optimum temperature for the second specie deposition lower than the first specie optimum temperature; and
reacting the second specie with the first specie at an optimum temperature for the reaction greater than the second specie optimum temperature and first specie optimum temperature.

24. The deposition method of claim 23 further comprising purging the first specie before depositing the second specie on the first specie.

25. The deposition method of claim 23 wherein the first specie is deposited from dichlorosilane, the second specie is deposited from ammonia, and the reacting produces $Si_3N_4$.

26. The deposition method of claim 23 wherein a chemisorption product of the first and second species consists essentially of a monolayer of a deposition material.

27. The deposition method of claim 23 wherein the first specie is different from the second specie.

28. The deposition method of claim 23 further comprising atomic layer depositing at least one additional specie along with deposition of the first specie andlor deposition of the second specie.

29. The deposition method of claim 23 wherein the first specie is an initial specie and is the same as the second specie.

30. The deposition method of claim 23 further comprising adding heat with the thermoelectric heat pump to obtain the optimum tern perature for the reaction.

31. The deposition method of claim 23 wherein the first and second specie optimum temperatures are those of at least a portion of the substrate.

32. The deposition method of claim 23 further comprising purging the first specie before depositing the second specie on the first specie.

33. A deposition method comprising:
chemisorbing a first monolayer of a first compound over a substrate while maintaining the substrate at a first temperature with a heater:
removing heat by applying an electric current through a cold junction of two dissimilar conductors or doped semiconductors of a device different from the heater, transferring the current to a hot junction of the conductors or semiconductors, and dissipating heat from the hot junction and establishing the substrate at a second temperature at least about 1° C. lower than the first temperature, the device exhibiting a thermoelectric effect;
chemisorbing a monolayer of a second compound on the first monolayer of the first compound at the second substrate temperature;
adding heat with the device exhibiting a thermoelectric effect by reversing direction of the electric current through the cold junction, transferring the current to the hot junction, and collecting heat from the hot junction to establish the substrate at approximately the first temperature; and
chemisorbing a second monolayer of the first compound on the monolayer of the second compound.

34. The deposition method of claim 33 wherein the second substrate temperature Is the optimum chemisorptlon temperature for the second compound.

35. The deposition method of claim 33 wherein the second temperature is established before the chemisorbing the monolayer of the second compound.

36. The deposition method of claim 33 wherein the second temperature is not established until during the chemisorbing the monolayer of the second compound.

37. The deposition method of claim 33 wherein the first monolayer is chemisorbed from dichlorosilane and the second monolayer is chemisorbed from ammonia.

38. The deposition method of claim 33 further comprising purging any first compound not chemisorbed before chemisorbing the second compound.

39. The deposition method of claim 33 wherein at least one of the first compound end the second compound is formed from a plurality of different precursor species.

40. A deposition method comprising:
chemisorbing a first monolayer of a first compound over a substrate while maintaining the substrate at a first temperature with a heater;
adding or removing heat by applying an electric current through a cold junction of two dissimilar conductors or doped semiconductors of a device different from the heater, transferring the current to a hot junction of the conductors or semiconductors; and, respectively, collecting or dissipating heat from the hot junction, establishing the substrate at a second temperature at least about 50° C. different from the first temperature, the device exhibiting a thermoelectric effect;
after purging any first compound not chemisorbed. chemisorbing a monolayer of a second compound on the first monolayer of the first compound at the second substrate temperature;
adding heat to establish the substrate at a third temperature at least about 50° C. higher than the second temperature and reacting the chemisorbed second compound with the chemisorbed first compound;

adding or removing heat by applying the electric current through the cold junction, transferring the current to the hot junction, and. resoectively. collecting or dissipating heat from the hot junction to establish the substrate at approximately the first temperature; and chemlsorbing a second monolayer of the first compound on the reacted layer of first and second compounds.

41. The deposition method of claim 40 wherein the third temperature is established after completing the chemisorbing the monolayer of the second compound.

42. The deposition method of claim 40 wherein the third temperature is established during the chemisorbing the monolayer of the second compound.

43. The deposition method of claim 40 wherein the first temperature Is greater than the second temperature.

44. The deposition method of claim 40 wherein at least one of the first compound and the second compound is formed from a plurality of different precursor species.

* * * * *

UNITED STATES PATENT AND TRADEMARK OFFICE
CERTIFICATE OF CORRECTION

PATENT NO.         : 7,368,014 B2
APPLICATION NO. : 09/927230
DATED                 : May 6, 2008
INVENTOR(S)      : Doan It is certified that error appears in the above-identified patent and that said Letters Patent is hereby corrected as shown below:

In column 8, line 21, in Claim 1, delete "chemisorbirig" and insert -- chemisorbing --, therefor.

In column 8, line 25, in Claim 1, delete "currant" and insert -- current --, therefor.

In column 8, line 27, in Claim 1, after "connected" delete "-".

In column 8, line 52, in Claim 6, delete "Initiating" and insert -- initiating --, therefor.

In column 8, line 62, in Claim 10, delete "end" and insert -- and --, therefor.

In column 9, line 2, in Claim 12, before "precursors." delete ",".

In column 9, line 7, in Claim 14, delete "firstand" and insert -- first and --, therefor.

In column 9, line 14, in Claim 17, delete "dichiorosilane" and insert -- dichlorosilane --, therefor.

In column 9, line 60, in Claim 28, delete "andlor" and insert -- and/or --, therefor.

In column 9, line 67, in Claim 30, delete "tern perature" and insert -- temperature --, therefor.

In column 10, line 10, in Claim 33, after "heater" delete ":" and insert -- ; --, therefor.

In column 10, line 31, in Claim 34, delete "Is" and insert -- is --, therefor.

In column 10, line 31, in Claim 34, delete "chemisorptlon" and insert -- chemisorption --, therefor.

In column 10, line 46, in Claim 39, delete "end" and insert -- and --, therefor.

In column 10, line 56, in Claim 40, after "semiconductors" delete ";" and insert -- , --, therefor.

In column 10, line 61, in Claim 40, after "chemisorbed" delete "." and insert -- , --, therefor.

UNITED STATES PATENT AND TRADEMARK OFFICE
CERTIFICATE OF CORRECTION

PATENT NO. : 7,368,014 B2
APPLICATION NO. : 09/927230
DATED : May 6, 2008
INVENTOR(S) : Doan It is certified that error appears in the above-identified patent and that said Letters Patent is hereby corrected as shown below:

In column 11, line 3, in Claim 40, after "and" delete ". resoectively." and insert -- , respectively, --, therefor.

In column 11, line 6, in Claim 40, delete "chemlsorbing" and insert -- chemisorbing --, therefor.

In column 12, line 5, in Claim 43, delete "Is" and insert -- is --, therefor.

Signed and Sealed this

Twenty-ninth Day of July, 2008

JON W. DUDAS
*Director of the United States Patent and Trademark Office*